(12) United States Patent
Kim et al.

(10) Patent No.: US 7,423,689 B2
(45) Date of Patent: Sep. 9, 2008

(54) CAMERA MODULE FOR MOBILE COMMUNICATION TERMINALS

(75) Inventors: Ho-Kyoum Kim, Suwon-si (KR); In-Soon Yu, Seoul (KR); Gwan-Ha Jeong, Suwon-si (KR)

(73) Assignee: Samsung Electro-Mechanics Co., Ltd, Kyunggi-Do (KR)

( * ) Notice: Subject to any disclaimer, the term of this patent is extended or adjusted under 35 U.S.C. 154(b) by 756 days.

(21) Appl. No.: 10/664,387

(22) Filed: Sep. 17, 2003

(65) Prior Publication Data

US 2004/0132491 A1 Jul. 8, 2004

(30) Foreign Application Priority Data

Jan. 7, 2003 (KR) ............... 10-2003-0000842
Mar. 3, 2003 (KR) ............... 10-2003-0013197

(51) Int. Cl.
*H04M 1/00* (2006.01)
*H04N 5/225* (2006.01)

(52) U.S. Cl. ............. 348/374; 455/575.3; 455/556.1

(58) Field of Classification Search ........... 348/14.02, 348/211.2, 359, 373, 374, 375, 376, 371, 348/68, 87; 116/3, 7; 399/4; 362/3, 4, 8; 455/556.1, 556.2, 557, 575.3

See application file for complete search history.

(56) References Cited

U.S. PATENT DOCUMENTS 5,378,306 A * 1/1995 Cibulsky et al. ............ 216/20
6,060,722 A * 5/2000 Havens et al. ............. 250/566
6,540,392 B1 * 4/2003 Braithwaite ............... 362/572
6,741,286 B2 * 5/2004 Meek et al. ................ 348/370
2001/0036845 A1 * 11/2001 Park ........................ 455/566
2001/0050717 A1 * 12/2001 Yamada et al. ............ 348/340
2003/0013484 A1 * 1/2003 Nishimura et al. ......... 455/556
2003/0036365 A1 * 2/2003 Kuroda ...................... 455/90
2003/0057430 A1 * 3/2003 Rinaldi et al. ............... 257/99

FOREIGN PATENT DOCUMENTS

| JP | 09-204843 | 8/1997 |
| JP | 11-338034 | 12/1999 |
| JP | 2000-069463 | 3/2000 |
| JP | 2000-270272 | 9/2000 |
| JP | 2002-231101 | 8/2002 |
| JP | 2002-244082 | 8/2002 |
| JP | 2002-330319 | 11/2002 |
| JP | 2002-365516 | 12/2002 |
| WO | WO 01/71316 | 9/2001 |

* cited by examiner

*Primary Examiner*—Ngoc-Yen Vu
*Assistant Examiner*—Albert H Cutler
(74) *Attorney, Agent, or Firm*—Gottlieb, Rackman & Reisman, P.C.

(57) ABSTRACT

Disclosed herein is a camera module for mobile communication terminals. The module comprises an image capture device unit for focusing an image of a subject, a LED (light emitting diode) unit for emitting light to the subject, a FPC (flexible printed circuit) electrically connected between the image capture device unit and the LED unit, and a connector unit for applying an electric signal to the image capture device unit.

8 Claims, 16 Drawing Sheets

CAMERA MODULE FOR MOBILE COMMUNICATION TERMINALS

BACKGROUND OF THE INVENTION

1. Field of the Invention

The present invention relates to a camera module for mobile communication terminals, and more particularly to a camera module for mobile communication terminals having an image capture device and an LED (light emitting diode) for emitting light to a subject, wherein the image capture device and the LED are integrated with each other, whereby a space required for installing the image capture device and the LED is considerably reduced.

2. Description of the Related Art

Portable devices, such as a mobile communication terminal with a camera mounted therein, a PDA (personal digital assistant) with a camera mounted therein, etc., have been developed and widely used as media for transmitting moving image information. The camera mounted in the mobile communication terminal or the PDA is a commonly used camera, which is operated on the basis of general principles for cameras. Specifically, the camera for the mobile communication terminal or the PDA has an image capture device mounted therein. In the image capture device is mounted an image sensor for receiving light from an external source of light to recognize the received light as an image.

In order to satisfy various desires of consumers, the camera for the mobile communication terminal or the PDA has a lens macro function enabling the camera to take a photograph at a short distance or a digital zoom function enabling the camera to enlarge a desired portion of the photograph, which has increasingly become one of the important functions of the camera.

In addition, the camera for the mobile communication terminal or the PDA preferably has a flash function enabling the camera to take a photograph in the dark or at night, which is a universal function already provided by an analog or digital camera.

Consequently, it is essential that a mobile communication terminal or a PDA designed to provide a photographing function in addition to a primary communication function for transmitting moving image information be equipped with an image capture device for recognizing an image and a LED for emitting light to a subject so that a photograph of the subject may be taken at night.

FIG. 1 is a perspective view of a conventional mobile communication terminal with a camera comprising an image capture device and an LED serving as a flashlight mounted therein. FIGS. 2a and 2b are a plan view and a longitudinal sectional view showing the image capture device of FIG. 1, respectively, and FIGS. 2c and 2d are a plan view and a longitudinal sectional view showing the LED of FIG. 1, respectively.

As shown in FIG. 1, the conventional mobile communication terminal 1 is equipped with a camera 2 having an image capture device 10 for capturing an image mounted therein, and an LED 20 for emitting light. The LED serves as a flashlight when taking a photograph at night.

The image capture device 10 mounted in the camera is connected to an image capture device connector 17 via a FPC (flexible printed circuit) 16, as schematically shown in FIG. 2a. The image capture device 10 comprises: a housing 11 having a space 12 defined therein; a camera lens 13 disposed to the upper part of the housing 11 for focusing an image; and a PCB (printed circuit board) 15 for supporting the housing 11, as shown in FIG. 2b. To the middle upper surface of the PCB 15 is mounted an image sensor 14. The image capture device 10 is connected to the image capture device connector 17 via the FPC 16. The image capture device connector 17 is connected to a motherboard (not shown) of the mobile communication terminal.

The LED 20 is a diode for emitting, as light, excessive energy generated when electrons or holes implanted using a p-n junction structure of a semiconductor are recombined. The LED 20 has several advantages in terms of processing speed, power consumption, and service life since the LED 20 is a kind of semiconductor. Furthermore, the LED 20 has high brightness, and thus also serves as a lighting apparatus.

The LED 20 is electrically attached to the PCB 23 by soldering, as schematically shown in FIG. 2c. The PCB 23 is connected to a LED connector 25 via a connection wire 24. Inside of the LED 20 is disposed a chip (not shown) for emitting light when electric current is applied to the chip. To the bottom surface of the LED 20 are attached a negative lead 21 made of a conductive metal for applying electric current to the chip and a positive lead 22 also made of a conductive metal for applying electric current to the chip. The negative and positive leads 21 and 22 are electrically attached to the PCB 23 by soldering. The LED 20 is connected to the LED connector 25 via the connection wire 24. The LED connector is also connected to the motherboard of the mobile communication terminal 1.

In the mobile communication terminal 1 with the above-stated construction, an electric signal is applied from the motherboard of the mobile communication terminal 1 to the PCB 15 having the image sensor 14 mounted thereon via the image capture device connector 17 and the FPC 16. The image sensor 14 recognizes an image of a subject on the basis of the applied signal.

When a flash is required for taking a photograph at night, a flash signal is applied from the motherboard of the mobile communication terminal to the PCB 23 via the LED connector 25 and the connection wire 24, and the LED 20 emits light forward on the basis of the applied signal. Since a subject is illuminated by means of the LED 20, a photograph of the subject can be clearly taken by the image capture device 10 even at night.

However, the conventional mobile communication terminal 1 having the camera mounted therein with the above-stated construction individually requires the image capture device connector 17 for transmitting an electric signal to the image capture device 10 and the LED connector 25 for transmitting an electric signal to the LED 20. As a result, a space required for installing the image capture device connector 17 and the LED connector 25 is large, which makes it difficult to properly arrange the connectors 17 and 25 in the mobile communication terminal.

Furthermore, the size of the mobile communication terminal is increased since the connectors 17 and 25 are disposed in the camera module mounted in the mobile communication terminal, the cost of manufacturing the mobile communication terminal is also increased since the connectors are required individually.

FIG. 3 is a partial perspective view of a conventional mobile communication terminal 30 with a camera 32 rotated as a camera hinge unit 31 is rotated. The mobile communication terminal of FIG. 3 is a folder-type communication terminal 30 with a camera 32 mounted therein. The camera 32 is attached to the camera hinge unit 31 so that the camera 32 can be rotated when the camera hinge unit 31 is rotated. The mobile communication terminal 30 with the rotating camera 32 has an advantage in that the camera directly faces the subject by rotation of the camera hinge unit 31, and thus it is not necessary to direct the mobile communication terminal 30 toward the subject.

As described above, the mobile communication terminal 30 is separately equipped with the image capture device connector and the LED connector, which requires a large space for installing the connectors. Consequently, the camera including the image capture device for capturing an image is mounted to the camera hinge unit 31, and the LED 33 for emitting light to a subject is mounted to some place other than the camera hinge unit 31 (a folder hinge unit in the case of the mobile communication terminal of FIG. 3). When the camera hinge unit 31 is manually or automatically rotated toward the subject, the camera 32 including the image capture device, which is mounted to the camera hinge unit 31, is rotated simultaneously with the rotation of the camera hinge unit 31 so that a photograph of the subject can be taken. However, the LED 33 is not mounted to the camera hinge unit 31, to which the image capture device is mounted. In other words, the LED 33 is fixed regardless of the rotation of the camera hinge unit 31. As a result, the direction in which the LED 33 emits light is different from the direction in which the camera 32 faces the subject. When a photograph of the subject is to be taken with the mobile communication terminal including the aforesaid camera at night, the angle of the mobile communication terminal must be adjusted so that the LED 33 is opposite to the subject, and then the camera hinge unit 31 must be rotated so that the camera 32 is also opposite to the subject. Consequently, the conventional mobile communication terminal having the aforesaid camera does not enjoy a technical merit that a photograph of the subject can be easily and conveniently taken simply by rotating the camera hinge unit 31.

Even if the image capture device connector 17 and the LED connector 25 are mounted together into the camera hinge unit 31, the arrangement of the connectors 17 and 25 is very difficult since the camera hinge unit 31 has a very small space, which increases time and cost required for mounting the connectors into the camera hinge unit 32.

SUMMARY OF THE INVENTION

Therefore, the present invention has been made in view of the above problems, and it is an object of the present invention to provide a camera module for mobile communication terminals having an image capture device unit and an LED (light emitting diode) unit for emitting light to a subject, characterized in that a LED connector is omitted by integrating the image capture device unit and the LED unit, whereby a space required for installing the image capture device and the LED is considerably reduced.

In accordance with one aspect of the present invention, the above and other objects can be accomplished by the provision of a camera module for mobile communication terminals, comprising: an image capture device unit for focusing an image of a subject; a LED (light emitting diode) unit for emitting light to the subject; a FPC (flexible printed circuit) electrically connected between the image capture device unit and the LED unit; and a connector unit for applying an electric signal to the image capture device unit.

In accordance with another aspect of the present invention, there is provided a camera module for mobile communication terminals, comprising: an image capture device unit for focusing an image of a subject; a LED for emitting light to the subject; a FPC including a first flexible part formed so that the image capture device unit is mounted thereon, a second flexible part formed so that the LED is mounted thereon, and a connection part for electrically connecting the first flexible part and the second flexible part, the first flexible part and the second flexible part being integrally formed with the connection part; and a connector unit for applying an electric signal to the FPC.

In accordance with yet another aspect of the present invention, there is provided a camera module for mobile communication terminals, comprising: an image capture device unit for focusing an image of a subject; a LED for emitting light to the subject; a rigid-flexible PCB including a first rigid part formed so that the image capture device unit is mounted thereon, a second rigid part formed so that the LED is mounted thereon, and a flexible connection part for electrically connecting the first rigid part and the second rigid part; and a connector unit for applying an electric signal to the rigid-flexible PCB.

In accordance with still another aspect of the present invention, there is provided a camera module for mobile communication terminals, comprising: a housing having a space defined therein; a camera lens disposed to the upper part of the housing for focusing an image of a subject; a PCB adapted for supporting the housing, the PCB having an image sensor for capturing the image of the subject mounted to the middle upper surface thereof; at least one LED disposed on the PCB outside the housing for emitting light to the subject; and a connector unit for applying an electric signal to the PCB.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
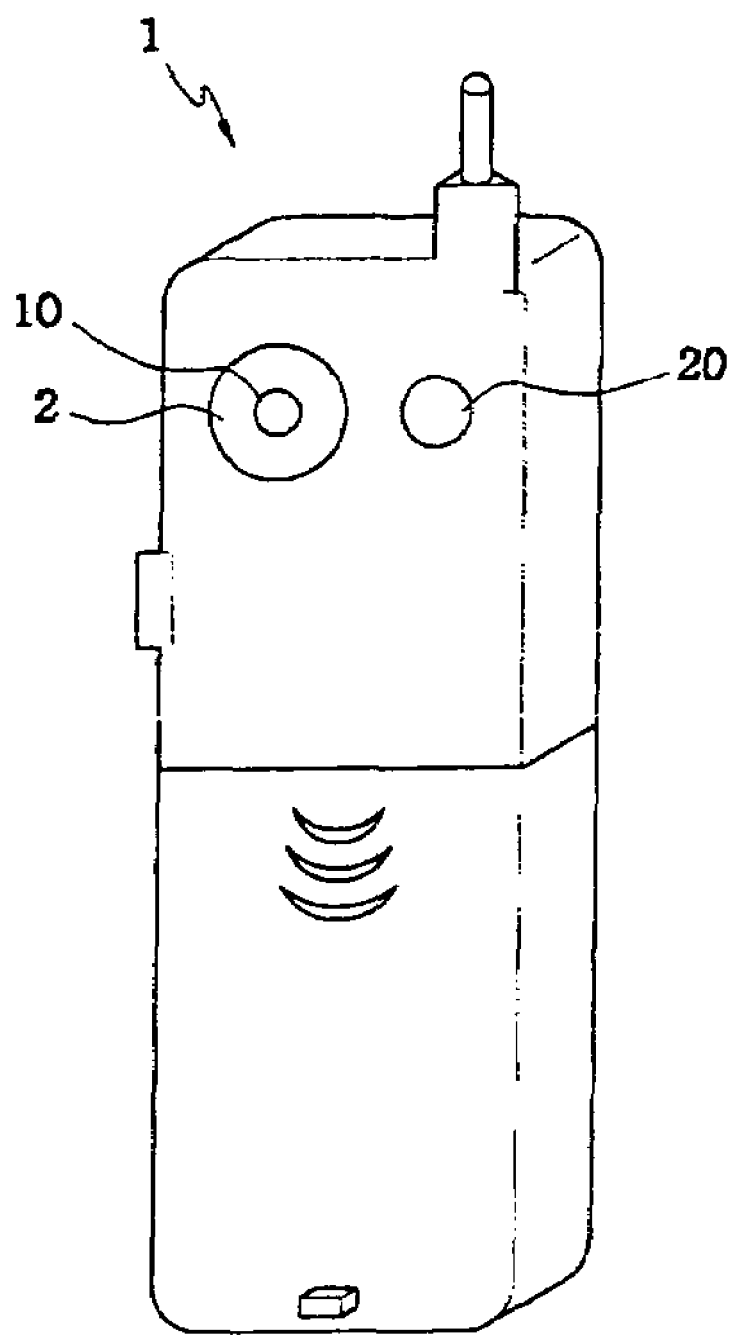
FIG. 1 is a perspective view of a conventional mobile communication terminal with a camera comprising an image capture device and an LED (light emitting diode) serving as a flashlight mounted therein.
Figure 2A:
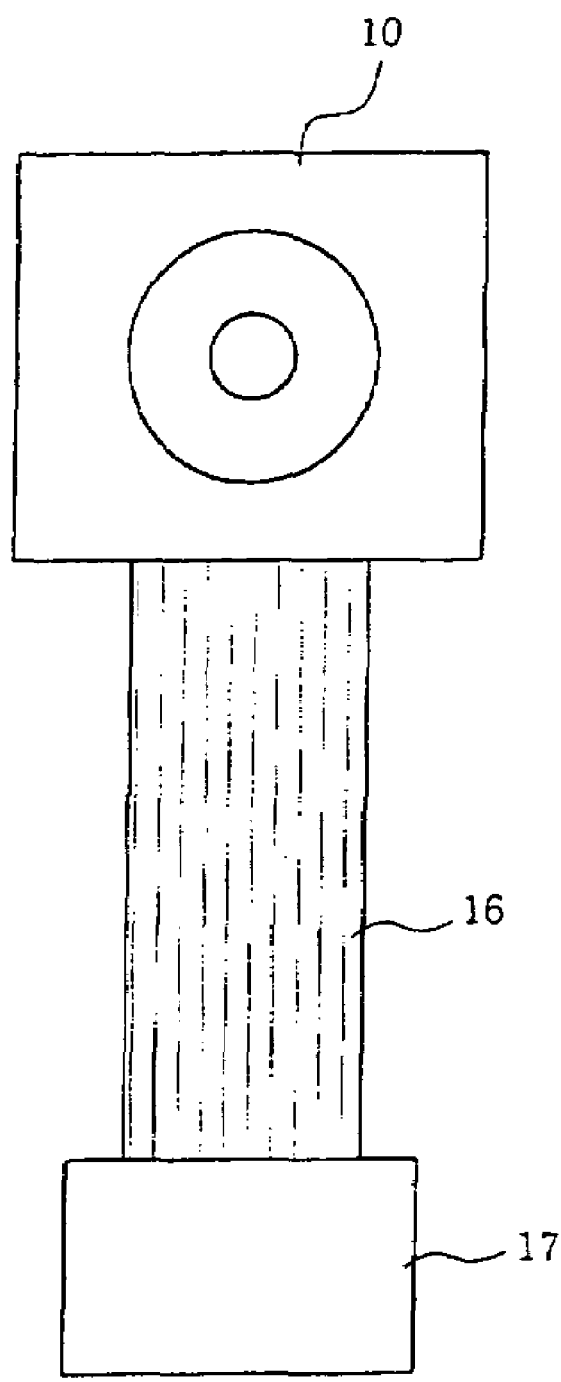
FIGS. 2a and 2b are a plan view and a longitudinal sectional view showing the image capture device of FIG. 1, respectively.
Figure 2B:
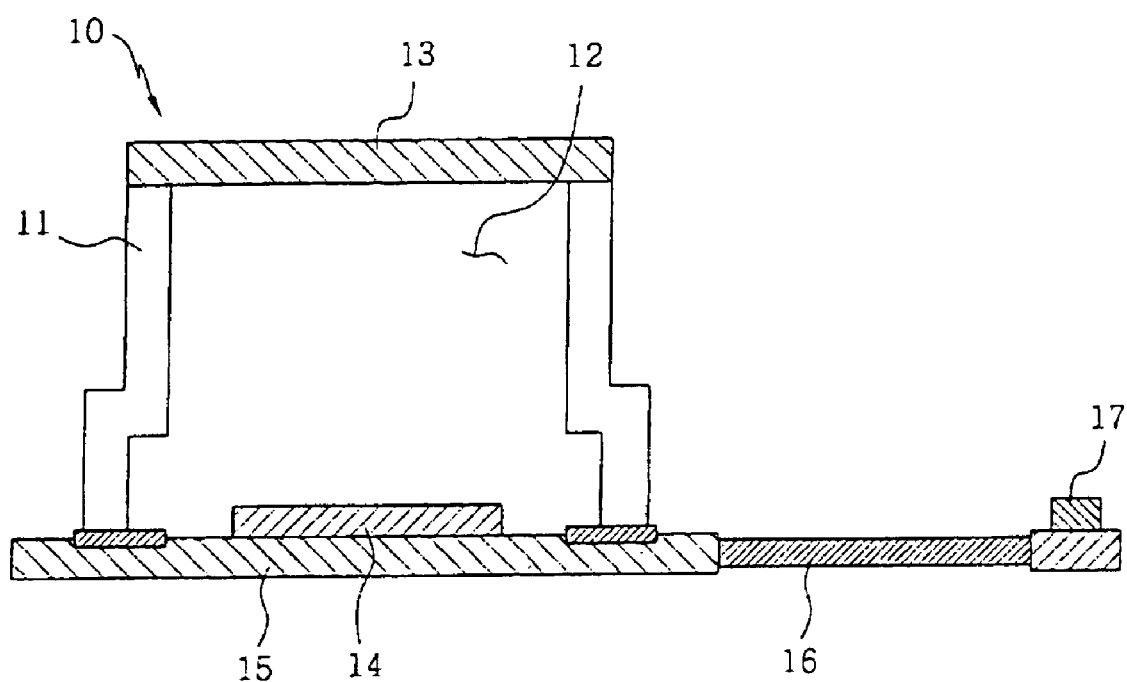
Figure 2C:
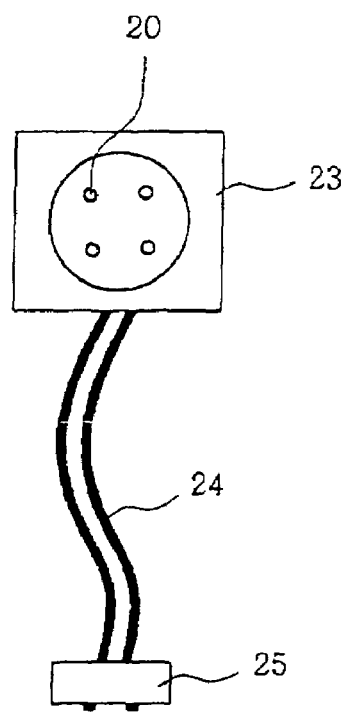
FIGS. 2c and 2d are a plan view and a longitudinal sectional view showing the LED of FIG. 1, respectively.
Figure 2D:
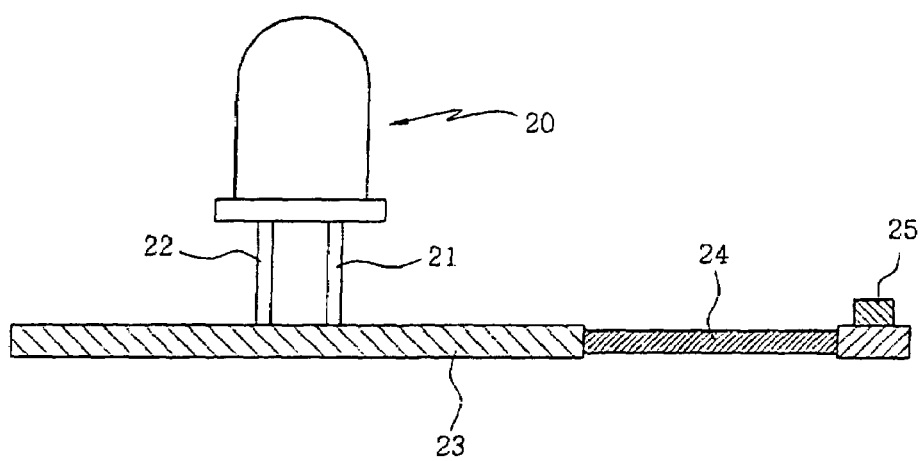

Now, preferred embodiments of the present invention will be described in detail with reference to the accompanying drawings. In the drawings, the same or similar elements are denoted by the same reference numerals even though they are depicted in different drawings.

Figure 4:
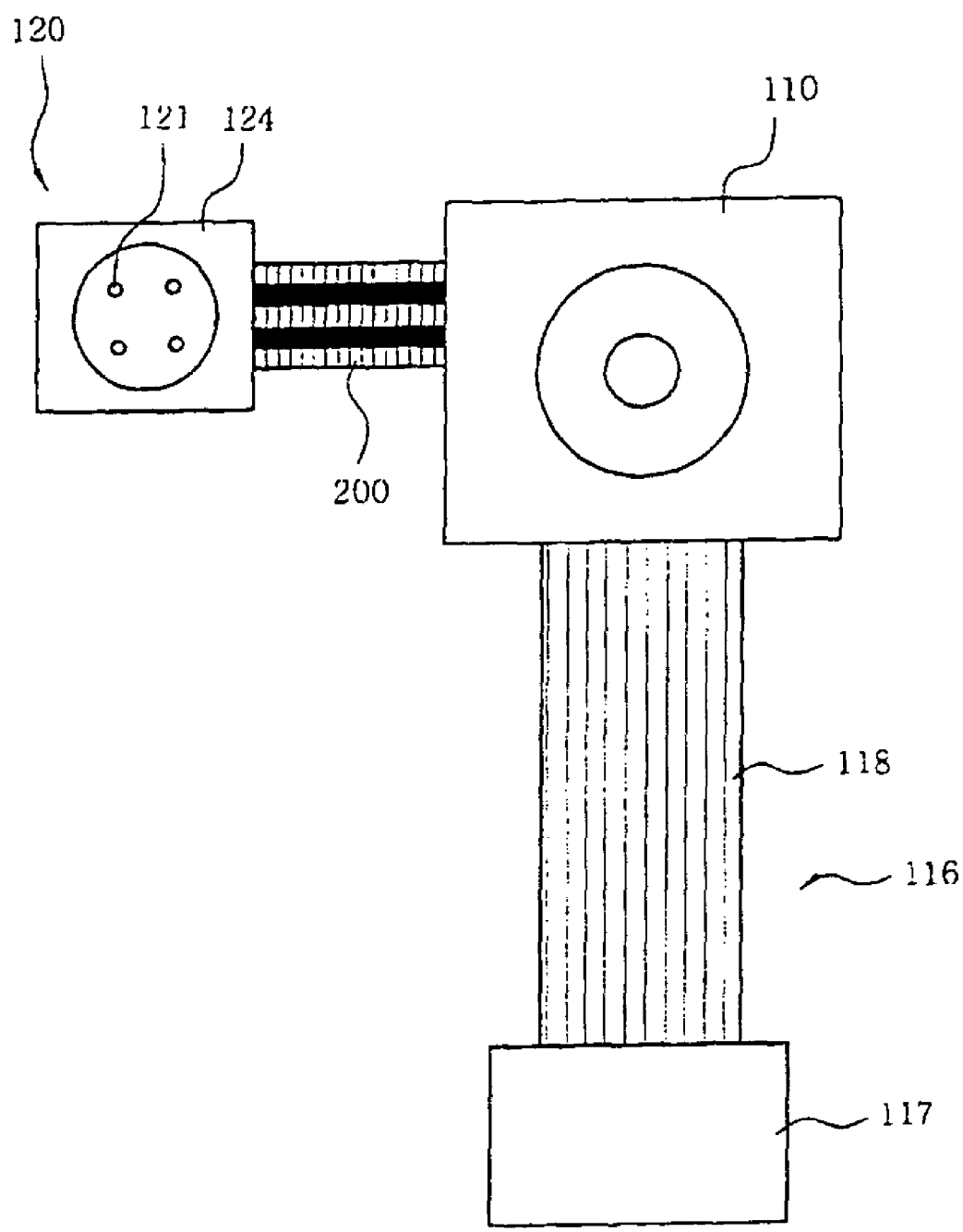
FIG. 4 is a plan view of a camera module for mobile communication terminals according to a first preferred embodiment of the present invention.
Figure 5:
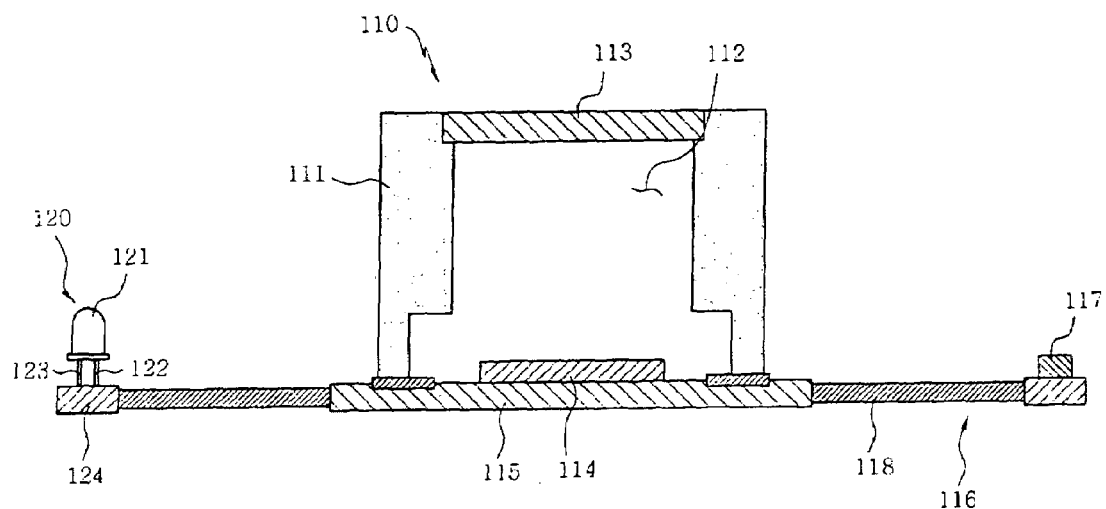
FIG. 5 is a longitudinal sectional view of the camera module for mobile communication terminals of the present invention as shown in FIG. 4.

FIG. 4 is a plan view of a camera module for mobile communication terminals according to a first preferred embodiment of the present invention, and FIG. 5 is a longitudinal sectional view of the camera module for mobile communication terminals of the present invention as shown in FIG. 4.

As shown in FIGS. 4 and 5, the camera module comprises: an image capture device unit 110 for focusing an image of a subject; a LED (light emitting diode) unit 120 for emitting light to the subject; a FPC (flexible printed circuit) 200 electrically connected between the image capture device unit 110 and the LED unit 120; and a connector unit 116 for applying an electric signal to the image capture device unit 110.

The image capture device unit 110 comprises: a housing 111 having a space 112 defined therein; a camera lens 113 disposed to the upper part of the housing 111 for focusing the image of the subject; and an image capture device PCB (printed circuit board) 115 adapted for supporting the housing 111, the PCB 115 having an image sensor 114 for capturing the image of the subject mounted to the middle upper surface thereof. The LED unit 120 comprises: a LED 121 for emitting light to the subject; and a LED PCB 124, on which the LED 121 is mounted. The connector unit 116 comprises: a connector 117 for applying electric current signal; and a FPC 118 electrically connected between the connector 117 and the image capture device unit 110.

In the image capture device 110, the camera lens 113 is supported by means of the housing 111. Specifically, to the upper end of the housing 111 is attached the camera lens 113 for focusing the image of the subject. Inside the housing 111 is defined the space 112, through which the image focused by the camera lens 113 is transmitted to the image sensor 114. The housing 111 also serves to prevent external foreign matters from reaching the image sensor 114 so that the image sensor 114 is protected. The lower end of the housing 111 is securely fixed to the PCB 115 by means of a bonding agent, such as epoxy resin.

Figure 6:
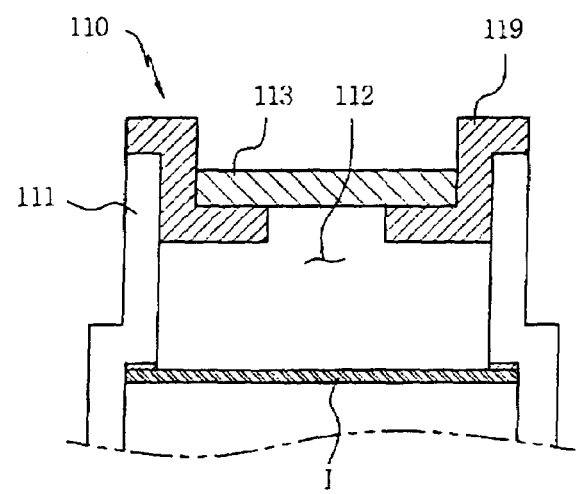
FIG. 6 is a longitudinal sectional view of an image capture device unit of the camera module for mobile communication terminals according to the first preferred embodiment of the present invention as shown in FIGS. 4 and 5, showing the image capture device further comprising a lens holder and an iris filter.

In the space 112 of the housing 111 is preferably provided an iris filter (IR filter) I, which is also called a diaphragm of a camera lens, as shown in FIG. 6. The iris filter I serves to control an amount of light of the image focused from the camera lens 113. The iris filter I is securely fixed to a predetermined place in the housing 111 by means of a bonding agent, such as epoxy resin. The camera lens 113 may be attached to the housing 111 via a lens holder 119, not directly attached to the housing 111. Specifically, the lens holder 119, which is provided to securely fix the camera lens 113, is attached to the upper end of the housing 111, and the camera lens 113 is attached to the lens holder 119.

Figure 7:
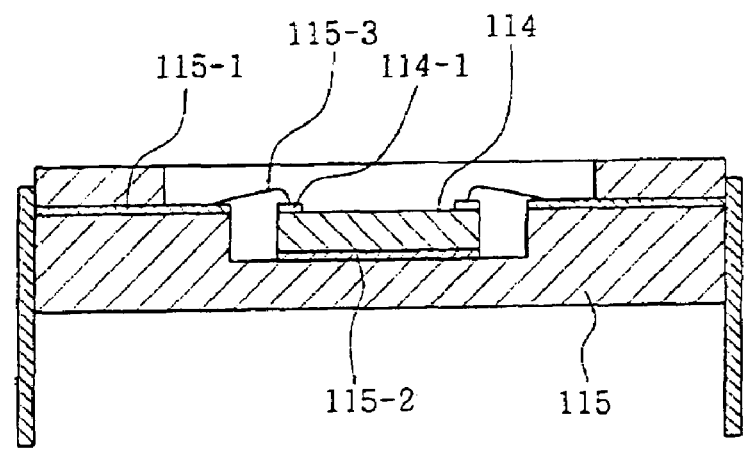
FIG. 7 is a longitudinal sectional view illustrating an example of mounting an image sensor of the present invention.

The image sensor 114 for recognizing the image captured by the camera lens 113 is mounted to the upper surface of the PCB 115. The image sensor 114 is mounted on the PCB 115 by well-known die bonding and wire bonding processes. Specifically, the image sensor 114 is fixed to the upper surface of the PCB 115 having a metallized conductor 115-1 formed thereon by the die bonding process using a conductive bonding agent 115-2, and an electrode pad 114-1 of the image sensor 114 is connected to the metallized conductor 115-1 by the wire bonding process using a metal wire 115-3, as shown in FIG. 7.

It should be noted, however, that a structure for mounting the image sensor of the camera module for mobile communication terminals according to the present invention is not limited to the aforesaid structure. For example, the image sensor may be mounted on the PCB using well-known mounting technologies, such as a flip-chip technology or a gold bump technology, or any other mounting technologies known by those skilled in the art before the filing date of the present application.

The LED 121 of the LED unit 120 is attached to the LED PCB 124 for emitting light to the subject. Any of well-known LEDs may be used as the LED of the present invention. An example of the LED is shown in FIG. 5. Inside of the LED 121 is disposed a chip (not shown) for emitting light when electric current is applied to the chip. To the bottom surface of the LED 121 are attached a negative lead 122 made of a conductive metal for applying electric current to the chip and a positive lead 123 also made of a conductive metal for applying electric current to the chip, as shown in FIG. 5. The LED 121 is electrically attached to the LED PCB 124 via the negative and positive leads 122 and 123, which are fixed to the LED PCB 124 by soldering. Alternatively, a SMD LED may be used as another example of the LED. The SMD LED is mounted to the surface of the LED PCB 124. Such surface mounting has advantages in that heat is efficiently released from the LED and the size of the LED is decreased, which makes it possible to manufacture the camera module for mobile communication terminals having a small size. The number of the LED 121 may be changed depending upon the distance between a subject and the LED, darkness around the subject, and required intensity of illumination.

The image capture device PCB 115 and the LED PCB 124 are electrically connected to each other via a connection member having a predetermined length. The connection member may be a connection wire, and preferably the FPC (flexible printed circuit) 200. The FPC 200 is suitable to use in the mobile communication terminal of the present invention, which is characterized by the small and thin structure thereof, since the FPC 200 is very flexible, and thus it is used while being bent or folded.

Figure 8:
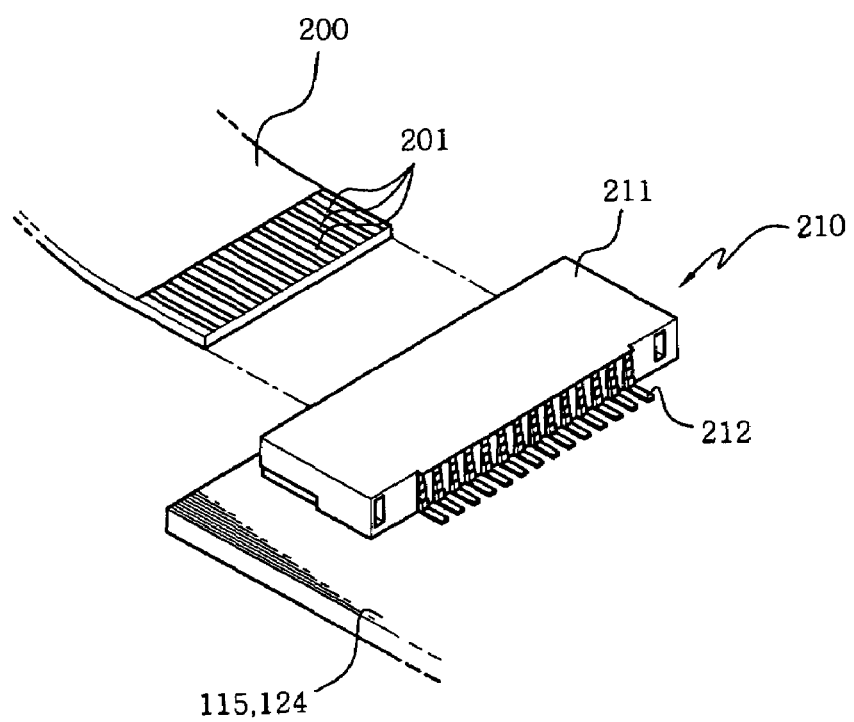
FIGS. 8 and 9 are a perspective view and a longitudinal view showing a FPC (flexible printed circuit) connected between a PCB (printed circuit board) for the image capture device of the present invention and a PCB for the LED of the present invention via a flexible cable connector, respectively.
Figure 9:
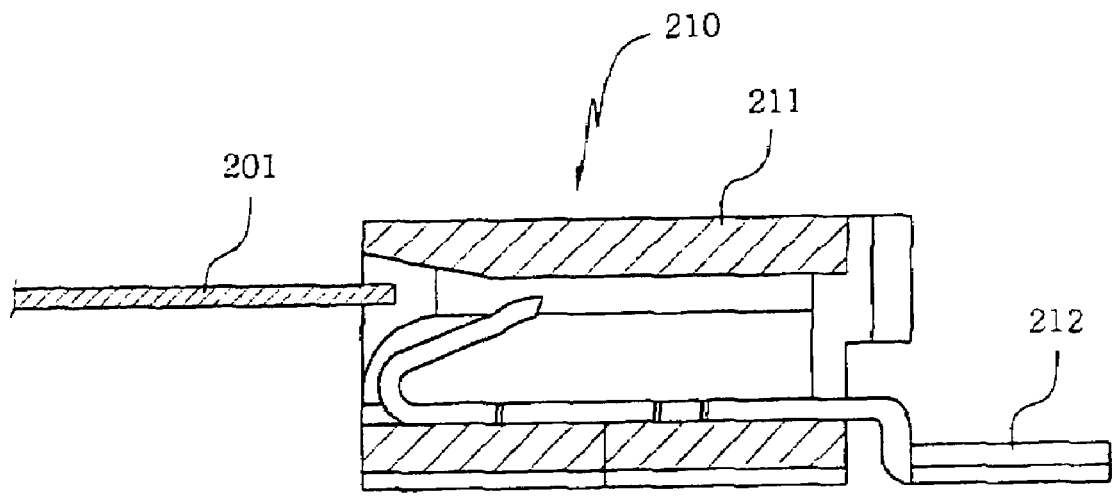

The image capture device PCB 115 and the LED PCB 124 are connected to the FPC 200, respectively, via a flexible cable connector 210 as shown in FIGS. 8 and 9.

The flexible cable connector 210 is usually called a film-type printed circuit board connector. As shown in FIGS. 8 and 9, the FPC 200 inserted into a connector body 211 of the flexible cable connector 210 via an insertion hole of the flexible cable connector 210 is pressed so that the FPC 200 is fixed. In the connector body 211 are provided a plurality of leads 212, which are uniformly spaced apart from each other and contact with contact points of an end 201 of the FPC 200. The leads 212 provided in the connector body 211 are also extended out of the connector body 211 so that the leads 212 are attached to the PCB 115 and the PCB 124 by soldering. When an actuator (not shown) is inserted into a connection groove formed in the connector body 211, the FPC 200 also inserted into the connector body 211 is electrically connected to the leads 212 of the connector body 211 by a retainer of the actuator. In this way, the image capture device 115 and the LED PCB 124 are electrically connected to each other via the FPC 200.

Figure 10:
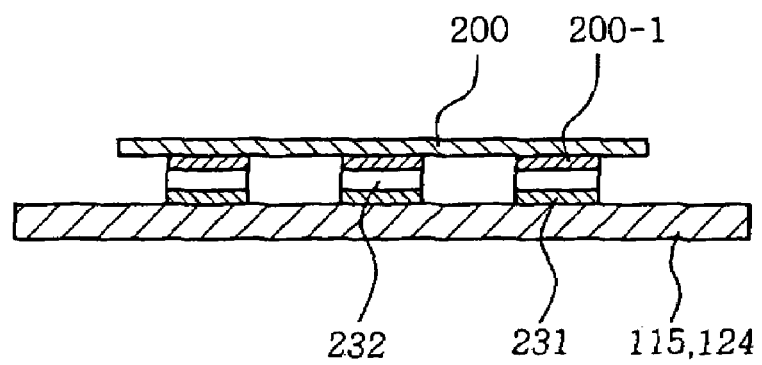
FIG. 10 is a longitudinal view showing a FPC connected between a PCB for the image capture device of the present invention and a PCB for the LED of the present invention by soldering.

The image capture device PCB 115 and the LED PCB 124 may be connected to the FPC 200, respectively, by soldering as shown in FIG. 10. As shown in FIG. 10, cream solders 231 are printed on connection circuit conductors 231 of each of the PCB 115 and 124, and then thermally pressed against circuit conductors 200-1 of the FPC 200, respectively. Alternatively, cream solders 232 are printed on the circuit conductors 200-1 of the FPC 200, and then thermally pressed against the circuit conductors 231 of each of the PCB 115 and 124, respectively. In this way, the image capture device PCB 115 and the LED PCB 124 are electrically connected to each other.

It should be noted, however, that a method for electrically connecting the EPC 200 and the PCBs 115 and 124 of the camera module for mobile communication terminal of the present invention is not limited to the aforesaid method. For example, the connection of the FPC 200 and the PCBs 115 and 124 may be carried out using anisotropic conductive film, anisotropic conductive paste, or adhesive resin. The anisotropic conductive film or the anisotropic conductive paste is obtained by dispersing conductive particles on resin film or resin paste and thermally pressing the resin film having the conductive particles dispersed thereon or the resin paste having the conductive particles dispersed thereon. The anisotropic conductive film or the anisotropic conductive paste has a one-way conductivity and an insulating property in the direction perpendicular to the conductive direction so that the film or the paste can be electrically connected. When the connection of the FPC 200 and the PCBs 115 and 124 is carried out using the an isotropic conductive film or the anisotropic conductive paste, the circuit conductors of the FPC and the circuit conductors of the PCB are electrically connected to each other via the conductive particles in the anisotropic conductive film or the anisotropic conductive paste. When the connection of the FPC 200 and the POBs 115 and 124 is carried out using the adhesive resin, which contains no conductive particles therein, the circuit conductors of the FPC are directly connected to the circuit conductors of the PCB.

The camera module for mobile communication terminal with the above-stated construction according to the first preferred embodiment of the present invention is connected to the connector 117 via the FPC 116, as shown in FIGS. 4 and 5. The connector 117 is connected to the motherboard (not shown) of the mobile communication terminal.

As compared with the conventional art in which two connectors 17 and 25 are required for the image capture device and the LED, the camera module of the present invention has an advantage in that the electric signal can be applied to the image capture device 110 and the LED 120 only using the connector unit 116.

According to the camera module for mobile communication terminal according to the first preferred embodiment of the present invention, the image capture device PCB 115 having the image sensor 114 mounted to the upper surface thereof and the LED PCB 124 having the LED 121 mounted thereon are constructed as one body by means of the FPC 200 so that the electric signal can be applied to the image capture device 110 integrated with the LED 120 only by means of the connector 117.

Figure 11:
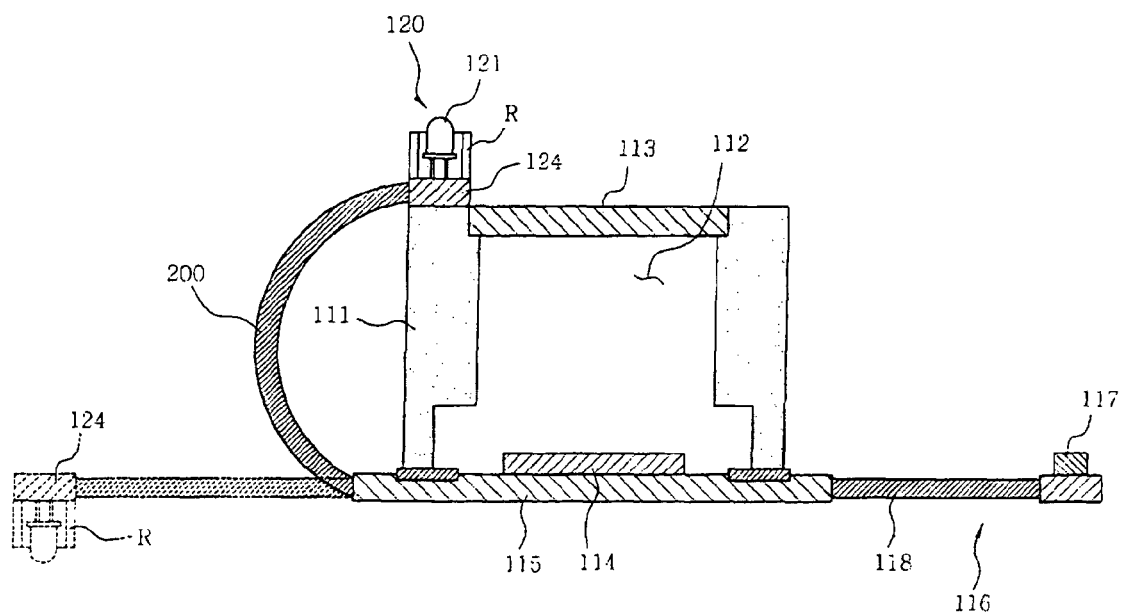
FIG. 11 is a longitudinal view of a camera module for mobile telecommunication terminals of the present invention, which is similar to the camera module for mobile telecommunication terminals of FIG. 5, showing a LED attached to a PCB for the LED upside down and a FPC bent so that the LED is uprightly attached to an image capture device unit.

The camera module for mobile communication terminal according to the first preferred embodiment of the present invention may be constructed by using the bending or folding property of the FPC. As shown in FIG. 11, the LED 121 is attached to the LED PCB 124 upside down, and the FPC 200 connecting the image capture device PCB 115 and the LED PCB 124 is bent or folded so that the LED 120 is attached to the image capture device unit 110, more specifically to the upper end of the housing 111 of the image capture device unit 110. Since the FPC 200 is bent or folded so that the LED 120 is attached to the upper end of the housing 111 of the image capture device unit 110, as shown in FIG. 11, a more intensive and more integrated camera module for mobile communication terminal can be obtained.

The LED unit 120 further comprises a retainer R for guiding the light emitted from the LED 121, as shown in FIG. 11. The retainer R serves to guide the light emitted from the LED 121 toward the subject in front of the camera and to prevent direct transmission of the light to the image sensor 114.

Figure 3:
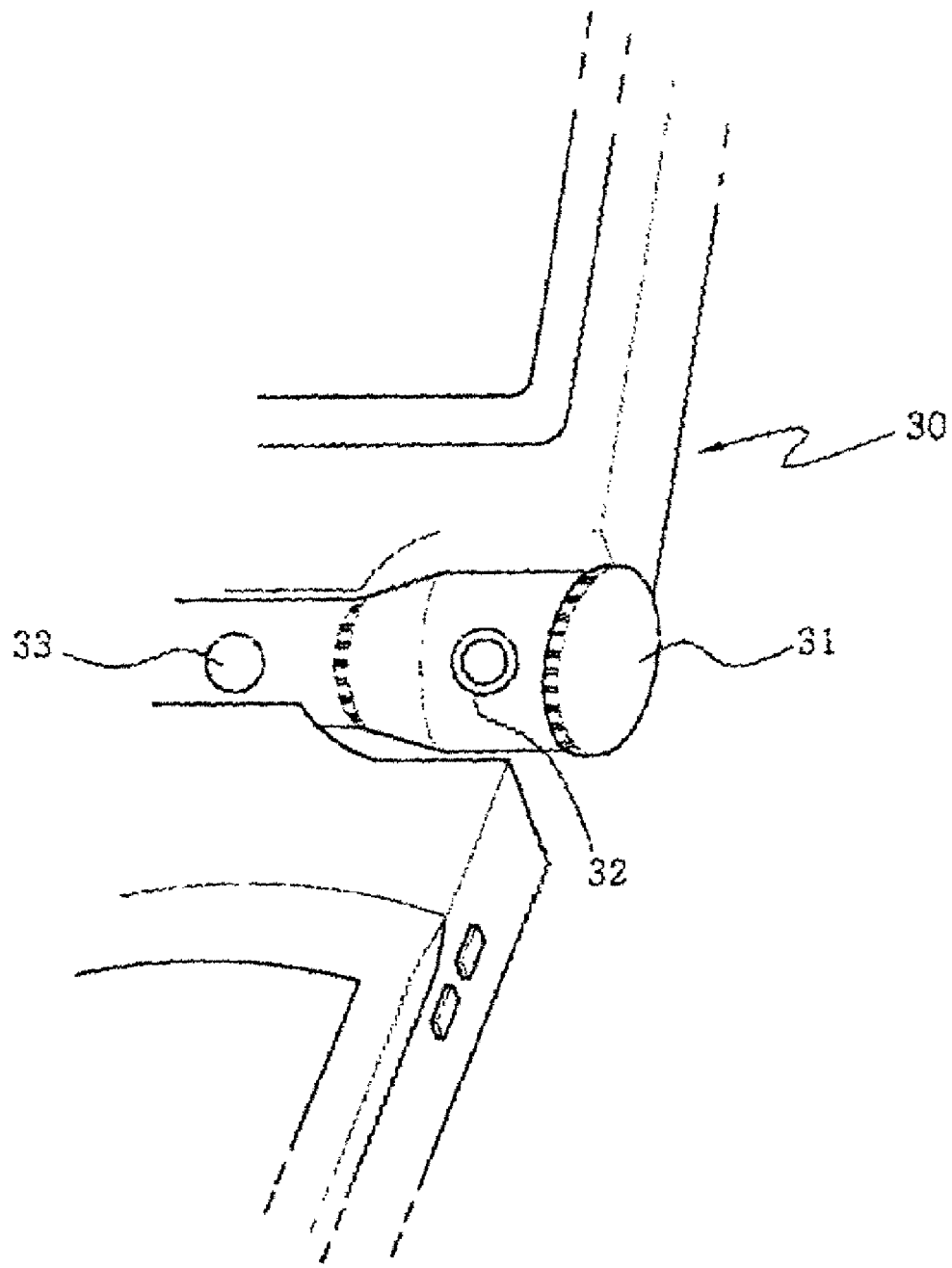
FIG. 3 is a partial perspective view of a conventional mobile communication terminal with a camera rotated as a camera hinge unit is rotated.
Figure 12:
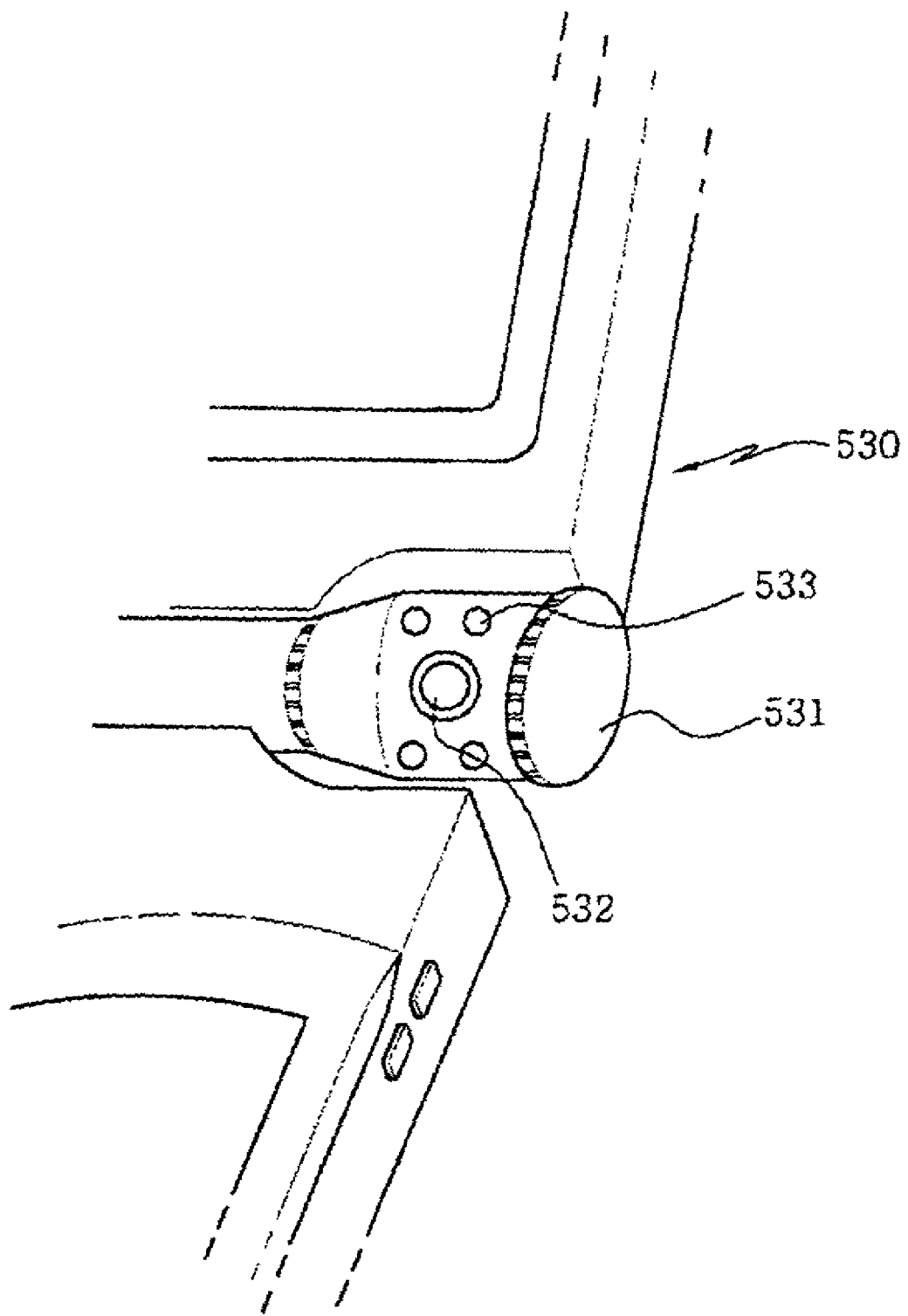
FIG. 12 is a partial perspective view showing a camera module of the present invention applied to a mobile communication terminal with a camera rotated as a camera hinge part is rotated.

In the conventional mobile communication terminal 30 having the camera 32 rotated with the rotation of the camera hinge unit 31, as shown in FIG. 3, the image capture device connector 17 and the LED connector 25 are separately provided in the mobile communication terminal 30 with the result that the space required for installing the image capture device connector 17 and the LED connector 25 is large, and thus it is difficult to properly arrange the connectors 17 and 25 in the mobile communication terminal 30. On the other hand, the image capture device unit 110 and the LED unit 120 are integrated by means of a single connector in accordance with the present invention, whereby a space required for installing the image capture device unit and the LED unit is considerably reduced. Furthermore, the FPC 200 is bent or folded so that the LED unit 120 is attached to the image capture device unit 110, whereby the camera module comprising the image capture device unit 110 and the LED unit 120 can be easily and conveniently mounted in the mobile communication terminal. According to the construction of the present invention as described above, the image capture device unit and the LED unit can be mounted in the camera hinge unit without restriction to installation and arrangement thereof. When the camera hinge unit is rotated as shown in FIG. 12, an image capture device unit 532 and a LED unit 533 are rotated simultaneously. Consequently, the direction in which the LED unit 533 emits light is always identical to the direction in which the image capture device unit 532 faces the subject.

Figure 13:
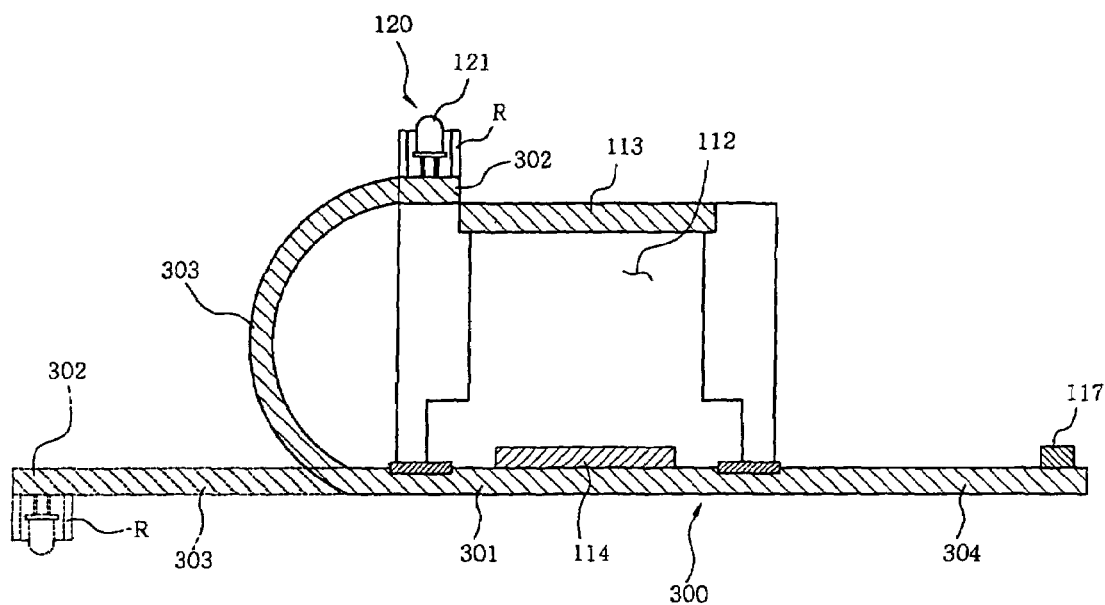
FIG. 13 is a longitudinal sectional view of a camera module for mobile communication terminals according to a second preferred embodiment of the present invention.

FIG. 13 is a longitudinal sectional view of a camera module for mobile communication terminals according to a second preferred embodiment of the present invention. As shown in FIG. 13, the camera module comprises: an image capture device unit for focusing an image of a subject; a LED unit for emitting light to the subject; a FPC 300 including a first flexible part 301 to which the image capture device unit is mounted, a second flexible part 302 to which the LED unit is mounted, and a connection part 303 for electrically connecting the first flexible part 301 and the second flexible part 302, the first flexible part 301 and the second flexible part 302 being integrally formed with the connection part 303; and a connector unit for applying an electric signal to the FPC 300.

According to the first preferred embodiment of the present invention, the image capture device PCB 115 and the LED PCB 124 are individually provided, and the image capture device PCB 115 and the LED PCB 124 are connected to each other via the FPC 200. In the second preferred embodiment of the present invention, however, there is used the FPC 300, which includes the first flexible part 301, the second flexible part 302, and the connection part 303 for electrically connecting the first flexible part 301 and the second flexible part 302. The first flexible part 301 and the second flexible part 302 are integrally formed with the connection part 303. To the upper surface of the first flexible part 301 is mounted an image sensor 114 for capturing an image of a subject. The first flexible part 301 supports a housing 111, the upper part of which a camera lens 113 for focusing the image of the subject is mounted. To the second flexible part 302 is mounted a LED 121 for emitting light to the subject as previously described.

In the second preferred embodiment of the present invention, the FPC is used which includes the first flexible part, the second flexible part, and the connection part for electrically connecting the first flexible part and the second flexible part, the first flexible part and the second flexible part being integrally formed with the connection part. Consequently, no structure for electrically connecting the PCBs 115 and 124 is required as compared with the first preferred embodiment of the present invention, and thus the construction of the camera module according to the second preferred embodiment of the present invention is simple, and the process of assembling the camera module is simplified. The operation and effect of the camera module according to the second preferred embodiment of the present invention is similar to those of the first preferred embodiment of the present invention, and thus a description of the operation and effect of the camera module according to the second preferred embodiment of the present invention will not be given.

A camera module for mobile communication terminals according to a third preferred embodiment of the present invention comprises: an image capture device unit for focusing an image of a subject; a LED unit for emitting light to the subject; a rigid-flexible PCB 400 including a first rigid part A to which the image capture device unit is mounted, a second rigid part A' to which the LED unit is mounted, and a flexible connection part B for electrically connecting the first rigid part A and the second rigid part A'; and a connector unit for applying an electric signal to the first rigid part A of the rigid-flexible PCB 400. (See FIG. 14)

In the third preferred embodiment of the present invention, the camera module is characterized by the rigid-flexible PCB 400 including the first rigid part A, the second rigid part A', and the flexible connection part B for electrically connecting the first rigid part A and the second rigid part A', which also serves as a printed circuit cable. To the first rigid part A of the rigid-flexible PCB 400 is mounted an image sensor 114 for recognizing an image of a subject captured by a camera lens 113. To the second rigid part A' of the rigid-flexible PCB 400 is mounted a LED 121 for emitting light to the subject. The first rigid part A and the second rigid part A' are electrically connected to each other via the flexible connection part B.

Figure 15:
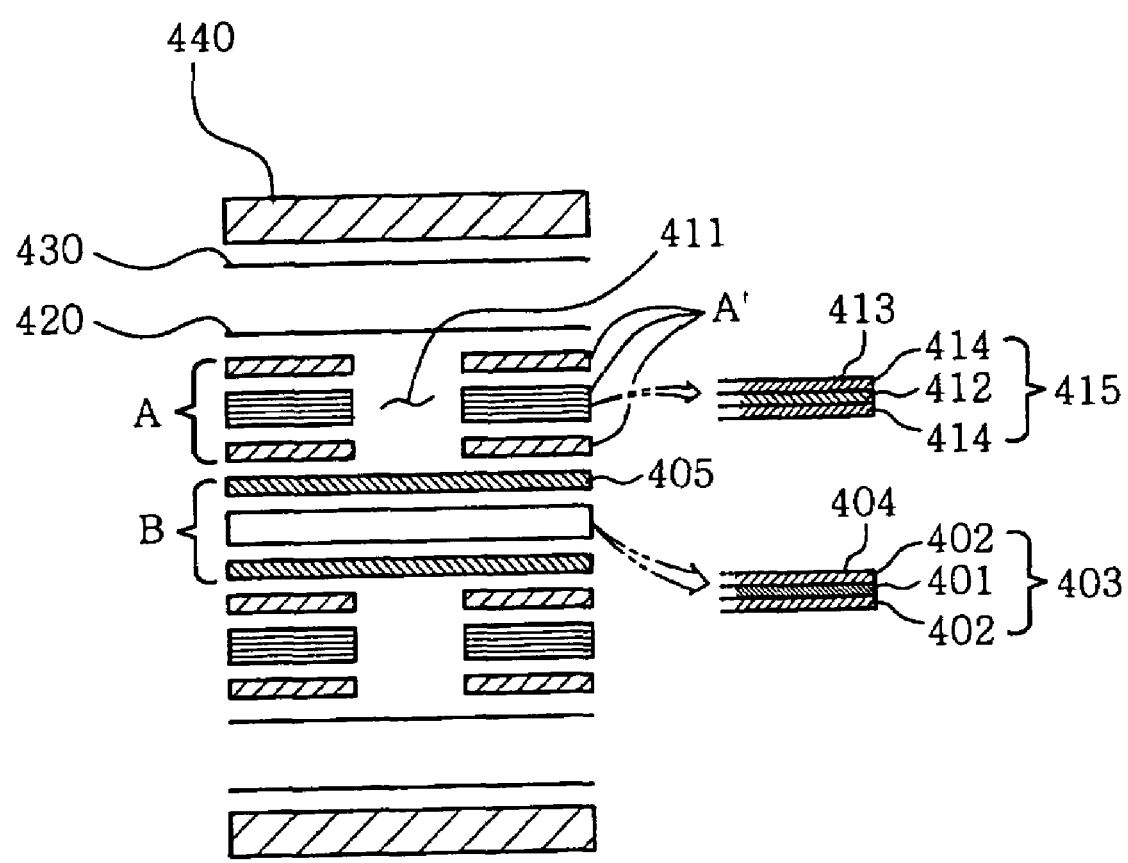
FIG. 15 is an exploded cross-sectional view illustrating a process for manufacturing the rigid-flexible PCB of FIG. 14.

The construction of the rigid-flexible PCB 400 will now be described with reference to FIG. 15. The flexible connection part B of the rigid-flexible PCB 400 is formed as follows: A copper clad laminate 403 is prepared which comprises a middle insulation layer 401 made of polyimide, and copper clad layers 402 attached to upper and lower surfaces of the middle insulation layer 401, as shown in FIG. 15. To the upper and lower surfaces of the copper clad layers 402 of the copper clad laminate 403 are formed copper clad patterns 404, respectively, by well-known exposing, developing, etching, and separating processes. To the outer surfaces of the copper clad laminate 403, on which the copper clad patterns 404 are formed, respectively, are attached cover coat layers 405. In this way, the flexible connection part B of the rigid-flexible PCB 400 is prepared.

Each of the rigid parts A and A' of the rigid-flexible PCB 400 is formed as follows: Another copper clad laminate 415 is prepared which comprises a middle insulation layer 412 and copper clad layers 414 attached to upper and lower surfaces of the middle insulation layer 412. To the outer surfaces of the copper clad layers 414 of the copper clad laminate 415 are formed copper clad patterns 413, respectively. In this way, the rigid parts A and A' of the rigid-flexible PCB 400 are prepared, respectively.

Figure 14:
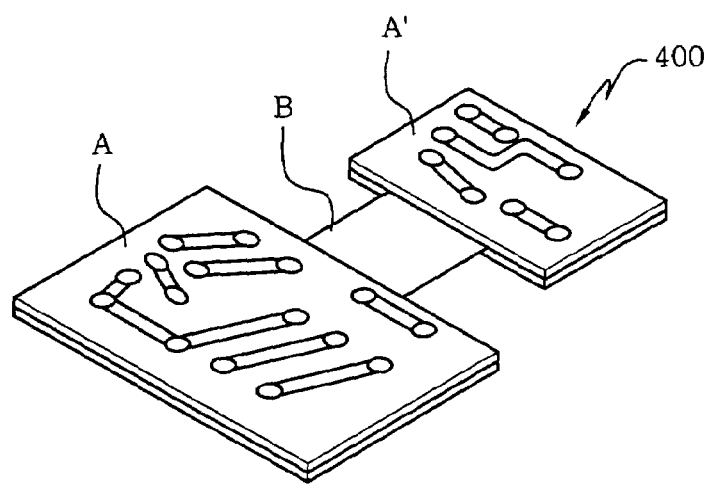
FIG. 14 is a perspective view of a rigid-flexible PCB used in a camera module for mobile communication terminals according to a third preferred embodiment of the present invention.

The rigid parts A and A' of the rigid-flexible PCB 400 are provided at the upper and lower surfaces of the flexible connection part B while the rigid parts A and A' are separated from each other by a separation part 411, which is provided for exposing the flexible connection part B. At least two rigid parts A are preferably stacked on the upper and lower surfaces of the flexible connection part B. Similarly, at least two rigid parts A' are also preferably stacked on the upper and lower surfaces of the flexible connection part B. To the outer surfaces of each of the rigid parts A and A' attached to the flexible connection part B are attached copper clad layers 420, respectively. Subsequently, a typical members 430 and cushion members 440 are attached in turn to the outer surfaces of the copper clad layers 420. All of the stacked components are compressed at high temperature. Finally, the rigid-flexible PCB 400 is manufactured as shown in FIG. 14.

To the first rigid part A of the rigid-flexible PCB 400 which is manufactured as described above are mounted an image sensor and a housing in the same way as the first preferred embodiment of the present invention. To the second rigid part A' of the rigid-flexible PCB 400 is mounted a LED. The first rigid part A and the second rigid part A' are electrically connected with each other via the flexible connection part B of the rigid-flexible PCB 400. It should be noted, however, that a rigid-flexible PCB according to the present invention is not limited to the aforesaid rigid-flexible PCB. Those skilled in the art will appreciate that the present invention may be applied to any well-known rigid-flexible PCB.

The camera module for mobile communication terminals according to this embodiment of the present invention is connected to the connecter 117 via the FPC. The connector 117 is connected to the motherboard (not shown) of the mobile communication terminal so that the camera module for mobile communication terminals is completely prepared. In the camera module according to this embodiment of the present invention, an electric signal can be applied to the image capture device and the LED using a single connector as in the construction of the camera module as shown in FIG. 5. Consequently, it is possible to manufacture a camera module for mobile communication terminals that is small-sized and thin, and thus requires a small space for installation in each of the mobile communication terminals. It is obvious that the LED can be mounted to the upper end of the housing since the flexible connection part B of the rigid-flexible PCB 400 can be bent and folded.

According to the present invention, other parts of the mobile communication terminal, such as an earphone jack or a speaker, may be constructed as one body, in addition to the LED.

Specifically, there may be provided a camera module for mobile communication terminals comprising: an image capture device PCB having an image sensor for capturing an image of a subject mounted to the upper surface thereof; at least one FPC connected to the image capture device PCB; at least one part-mounting PCB electrically connected to the image capture device PCB via the FPC; at least one mobile communication terminal part mounted on the part-mounting PCB; and a connector for applying an electric signal to the image capture device PCB.

There may be also provided a camera module for mobile communication terminals comprising: an image sensor for focusing an image of a subject; at least one mobile communication terminal part; a rigid-flexible PCB including a first rigid part to which the image sensor is mounted, at least one second rigid part to which the mobile communication terminal part is mounted, and at least one flexible connection part for electrically connecting the first rigid part and the second rigid part; and a connector for applying an electric signal to the first rigid part of the rigid-flexible PCB.

Figure 16:
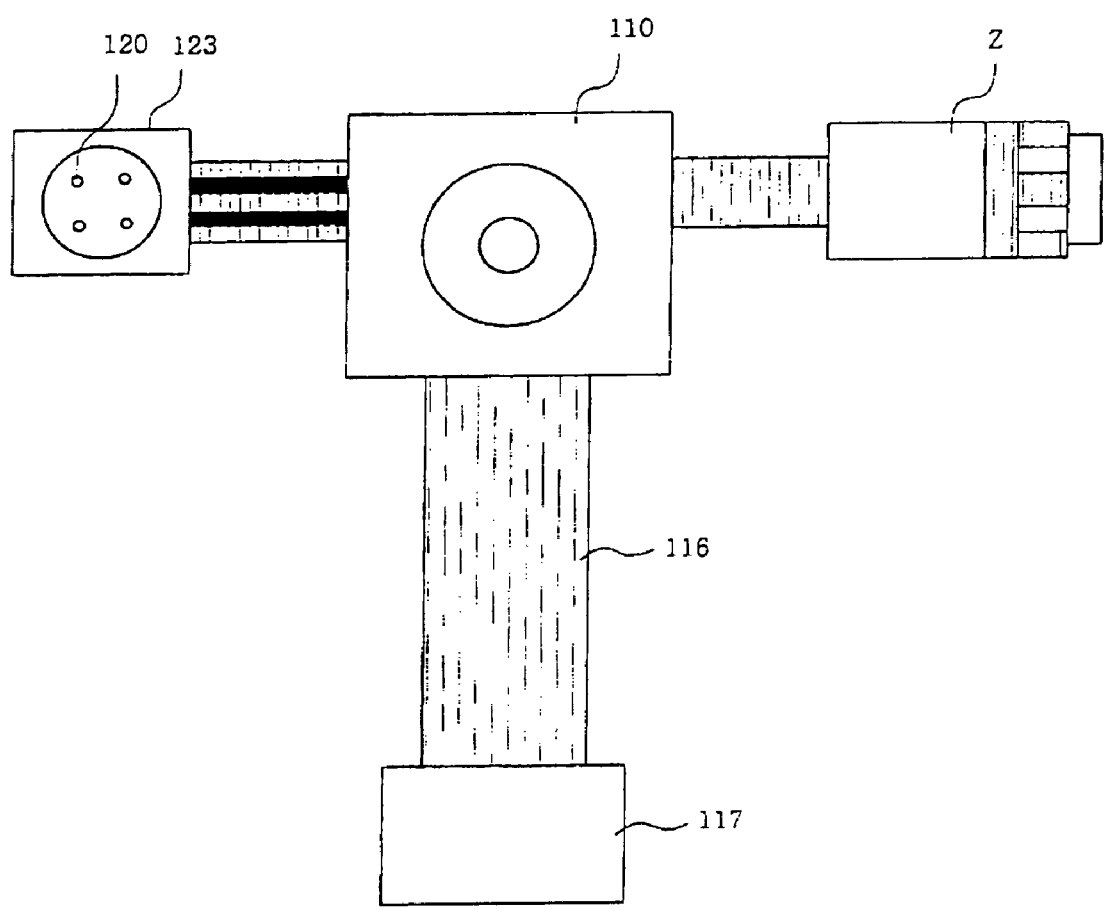
FIG. 16 is a plan view of a camera module for mobile communication terminals of the present invention, showing an LED and an earphone jack integrated with the LED.

FIG. 16 is a plan view of a camera module for mobile communication terminals of the present invention, showing an LED and an earphone jack Z integrated with the LED. In the first preferred embodiment of the present invention, the plurality of FPCs are connected to the PCB having the image sensor mounted thereon, and the part-mounting PCB is connected to one of the FPCs, whereby a plurality of parts can be driven using only a single connector. In the second preferred embodiment of the present invention, a plurality of rigid parts and a plurality of flexible parts for connecting the plurality of rigid parts to each other are integrally manufactured to form the rigid-flexible PCB, which provides the same construction and effect as mentioned above.

Figure 17:
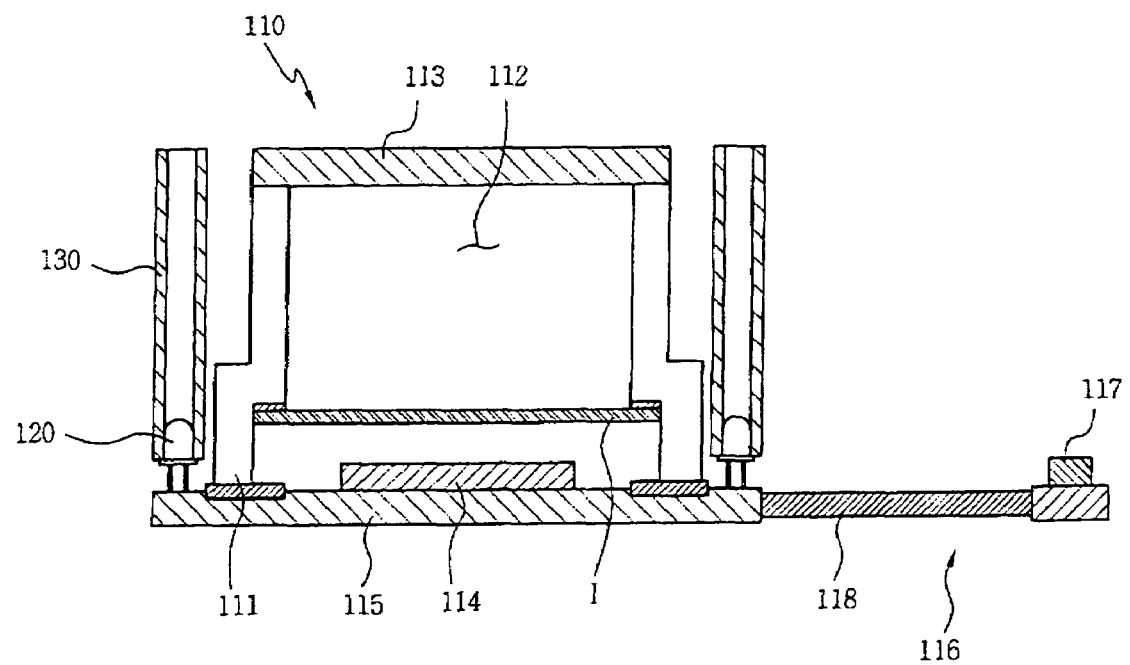
FIG. 17 is a longitudinal sectional view of a camera module for mobile communication terminals according to a fourth preferred embodiment of the present invention.

FIG. 17 is a longitudinal sectional view of a camera module for mobile communication terminals according to a fourth preferred embodiment of the present invention. The camera module comprises: a housing 111 having a space 112 defined therein; a camera lens 113 disposed to the upper part of the housing 111 for focusing an image of a subject; an image capture device PCB 115 adapted for supporting the housing 111, the PCB 115 having an image sensor 114 for capturing the image of the subject mounted to the middle upper surface thereof; at least one LED 120 disposed on the PCB 115 outside the housing for emitting light to the subject; and a connector unit 116 for applying an electric signal to the PCB 115.

The aforementioned fourth preferred embodiment of the present invention is characterized in that the LED 120 is directly mounted on the PCB 115, oh which the image sensor is also mounted. Accordingly, on the PCB 115 are formed a circuit pattern for applying an electric signal to the image sensor 114 and a circuit pattern for applying an electric signal to the LED 120. In the space 112 of the housing 111 may be provided an iris filter (IR filter) I, which serves to control an amount of light of the image focused from the camera lens 113, as in the previous preferred embodiments of the present invention. Also, the camera lens 113 may be attached to the housing 111 via the lens holder 119. The LED 120 is preferably a SMD LED.

According to the fourth preferred embodiment of the present invention with the above-stated construction, the image sensor 114 and the LED 120 can be driven only by means of the connector 117 since the image capture device 110 and the LED 120 are integrated as one body, whereby a space for installing the camera module is considerably reduced.

Furthermore, around the LED 120 may be provided an optical fiber 130 for forwardly guiding the light emitted from the LED 120.

Figure 18:
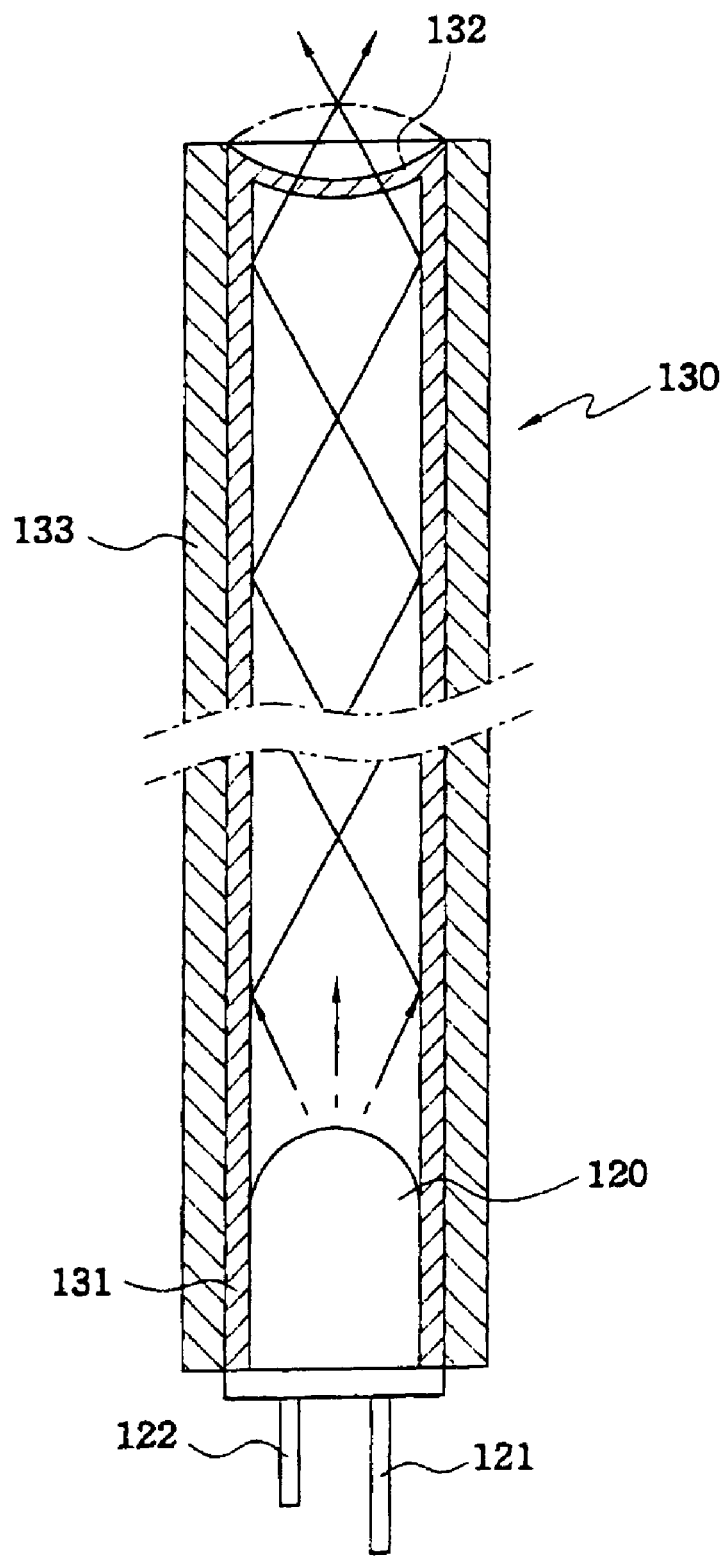
FIG. 18 is a longitudinal sectional view of an optical fiber exemplarily used in the camera module for mobile communication terminals according to the fourth preferred embodiment of the present invention.

FIG. 18 is a longitudinal sectional view of the optical fiber 130 exemplarily used in the camera module for mobile communication terminals according to the fourth preferred embodiment of the present invention.

As shown in FIG. 18, the optical fiber 130 is a fibriform waveguide adapted for transmitting light, which is formed in the shape of a cylinder comprising a core part and a cladding part surrounding the core part. The optical fiber 130 has an open end 131 and a closed end 132. The optical fiber 130 is fitted around the LED 120 through the open end 131. When the optical fiber 130 is securely fitted around the LED 120, the light emitted from the LED 120 is transmitted forward while the light is refracted in the optical fiber 130.

The closed end 132 of the optical fiber 130 may be concave or convex, if necessary. When the closed end 132 of the optical fiber 130 is convex as indicated by an imaginary line in FIG. 18, the light emitted from the LED 120 is divergent. On the other hand, when the closed end 132 of the optical fiber 130 is concave as indicated by a solid line in FIG. 18, the light emitted from the LED 120 is convergent. Consequently, the closed end 132 of the optical fiber 130 is preferably concave so that capturing of image is possible at a long distance. Furthermore, the optical fiber 130 is preferably coated with a flexible conduit tube 133 for preventing any bending or damage to the optical fiber 130 due to external impact. The flexible conduit tube 133 is preferably made of a transparent glass, although a plastic optical fiber made of polycarbonate-based resin may be used. As mentioned above, the optical fiber having the characteristic of forwardly guiding light is applied to the camera module for mobile communication terminal according to this embodiment of the present invention. Consequently, the diffusion of the light is minimized, and thus the intensity and amount of the light illuminating the subject are maximized. In other words, the light is not directly transmitted from the LED, but from the closed end of the optical fiber, which is placed at a predetermined height from the LED, whereby the diffusion of the light is minimized.

As apparent from the above description, the present invention provides a camera module for mobile communication terminals wherein an image capture device is integrated with a LED, whereby the number of connectors mounted in the camera module, and thus the camera module can be manufactured in a small-sized and thin structure.

Furthermore, the image capture device and the LED integrated with the image capture device are mounted together in a camera hinge part of the mobile communication terminal, so that the LED is also rotated when the camera hinge unit is rotated. Consequently, the present invention enjoys a technical merit that a photograph of a subject can be easily and conveniently taken simply by rotating the camera hinge unit.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A camera module for mobile communication terminals, comprising:
   an image capture device unit for focusing an image of a subject including a housing having a space defined therein, a camera lens disposed to the upper part of the housing for focusing the image of the subject, and an image capture device PCB (printed circuit board) adapted for supporting the housing and formed so that an image sensor for capturing the image of the subject is mounted to the middle upper surface thereof;
   an LED (light emitting diode) unit for emitting light to the subject mounted on the housing and including a LED for emitting light to the subject and a LED PCB formed so that the LED is mounted thereon;
   a FPC (flexible printed circuit) electrically connected between the image capture device unit and the LED unit;
   a connector unit installed in a motherboard for applying an electric signal to the image capture device unit; and
   another FPC electrically connected between the image capture device unit and the connector unit;
   wherein, both the image capture device unit and the LED unit are electrically connected to the mother board via only one connector and both are rotatable with relation to the mother board.

2. The module as set forth in claim 1, further comprising an iris filter (IR filter) disposed in the space of the housing for controlling an amount of light of the image focused from the camera lens.

3. The module as set forth in claim 1 further comprising:
   at least one FPC connected to the image capture device PCB;
   at least one part-mounting PCB electrically connected to the image capture device PCB via at least one FPC; and
   at least one mobile communication terminal part mounted on the part-mounting PCB;
   wherein, all of the image capture device unit, the LED unit and at least one mobile communication terminal part are electrically connected to the mother board via only one connector unit.

4. A camera module for mobile communication terminals, comprising:
   an image capture device unit for focusing an image of a subject including a housing having a space defined therein, a camera lens disposed to the upper part of the housing for focusing the image of the subject, and an image sensor installed in the housing;
   an LED for emitting light to the subject mounted on the housing;
   a FPC including a first flexible part adapted for supporting the housing and formed so that the image sensor is mounted thereon, a second flexible part formed so that the LED is mounted thereon, and a connection part for electrically connecting the first flexible part and the second flexible part,
   wherein, both the first flexible part and the second flexible part being integrally formed with the connection part; and
   a connector unit installed in a motherboard for applying an electric signal to the FPC;
   wherein at least a portion of the FPC is electrically connected to the connector unit, and both the image capture device unit and the LED are electrically connected to the mother board via only one connector unit and both are rotatable with relation to the mother board.

5. The module as set forth in claim 4 further comprising:
   at least one FPC electrically connected to the first flexible part;
   at least one mobile communication terminal part mounted on at least one FPC;
   wherein, all of the image capture device unit, the LED and at least one mobile communication terminal part are electrically connected to the mother board via only one connector unit.

6. The module as set forth in claim 4, further comprising an iris filter (IR filter) disposed in the space of the housing for controlling an amount of light of the image focused from the camera lens.

7. A camera module for mobile communication terminals, comprising:
   an image capture device unit for focusing an image of a subject including a housing having a space defined therein, a camera lens disposed to the upper part of the housing for focusing the image of the subject, and an image sensor installed in the housing;
   an LED for emitting light to the subject mounted on the housing;
   a rigid-flexible PCB including a first rigid part adapted for supporting the housing and formed so that the image capture device unit is mounted thereon, a second rigid part formed so that the LED is mounted thereon, and a flexible connection part for electrically connecting the first rigid part and the second rigid part;
   a connector unit installed in a motherboard for applying an electric signal to the rigid-flexible PCB; and
   another FPC electrically connected between the rigid-flexible PCB and the connector unit;
   wherein, both the image capture device unit and the LED are electrically connected to the mother board via only one connector unit and both are rotatable with relation to the mother board.

8. The module as set forth in claim 7 further comprising:
   at least one mobile communication terminal part;
   another rigid-flexible PCB including a flexible part electrically connected to the first rigid part and a rigid part electrically connected to the flexible part and formed so that at least one mobile communication terminal part is mounted thereon;
   wherein, all of the image capture device unit, the LED and at least one mobile communication terminal part are electrically connected to the mother board via only one connector unit.

* * * * *